United States Patent
Andresen et al.

(10) Patent No.: US 7,859,267 B2
(45) Date of Patent: Dec. 28, 2010

(54) TESTING DEVICE FOR LIGHTING MEANS

(75) Inventors: Michael Andresen, Sankt Georgen (DE); Markus Schwär, Sankt Peter (DE); Jürgen Herr, Elzach-Yach (DE)

(73) Assignee: Hoover Dam Technology GmbH, Glottertal (DE)

( * ) Notice: Subject to any disclaimer, the term of this patent is extended or adjusted under 35 U.S.C. 154(b) by 256 days.

(21) Appl. No.: 12/213,535

(22) Filed: Jun. 20, 2008

(65) Prior Publication Data

US 2008/0315885 A1    Dec. 25, 2008

(30) Foreign Application Priority Data

Jun. 22, 2007    (DE) .................. 10 2007 029 230

(51) Int. Cl.
*G01R 31/24* (2006.01)
(52) U.S. Cl. .................. 324/414; 324/403; 315/291
(58) Field of Classification Search .................. 324/403, 324/414; 315/291
See application file for complete search history.

(56) References Cited

U.S. PATENT DOCUMENTS

| 3,967,191 A | 6/1976 | Roche |
| 5,047,721 A | 9/1991 | Farley |
| 5,323,116 A | 6/1994 | Atria |
| 2003/0222588 A1* | 12/2003 | Myron et al. ............... 315/159 |

FOREIGN PATENT DOCUMENTS

| DE | 39 28 645 | 3/1991 |
| DE | 201 16 815 U1 | 5/2002 |
| EP | 0 413 991 A1 | 2/1991 |

* cited by examiner

*Primary Examiner*—Vincent Q Nguyen
(74) *Attorney, Agent, or Firm*—The Nath Law Group; Stanley N. Protigal; Jerald L. Meyer

(57) ABSTRACT

A testing device (1) for a lamp (3) operated at a nominal voltage (Vn) and at a nominal frequency (fn), having a capacitive coupling of a test voltage (Vp) at a testing frequency of (fp) to the lamp (3), wherein a coupled test voltage (Vpa) corresponds to the nominal voltage (Vn), and a coupled test frequency (fpa) corresponds to the nominal frequency (fn). The testing device is capable of testing a gas-filled lamp having integrated upstream electronics between power supply connections and a gas filled portion.

19 Claims, 2 Drawing Sheets

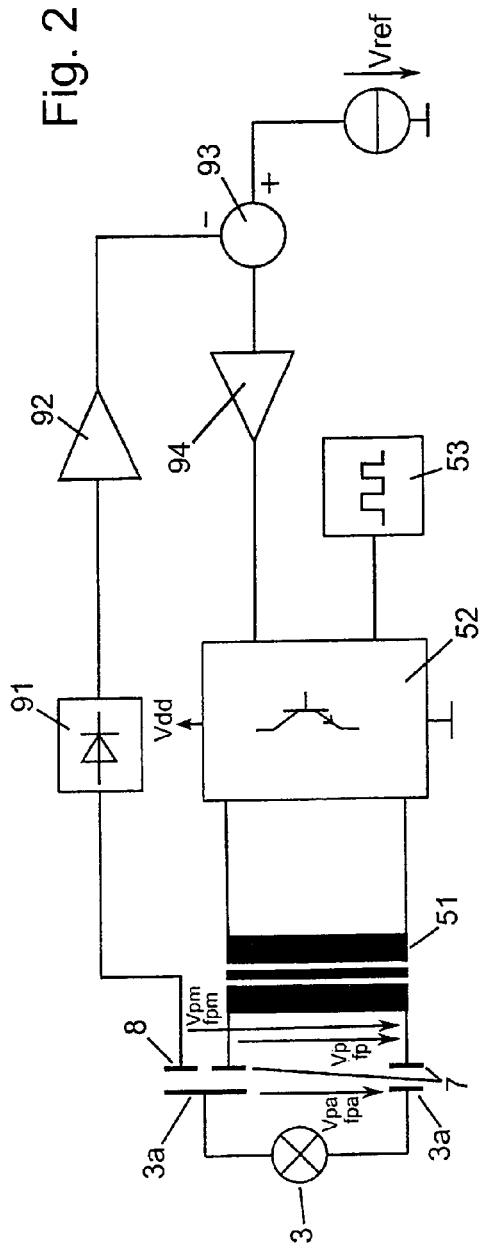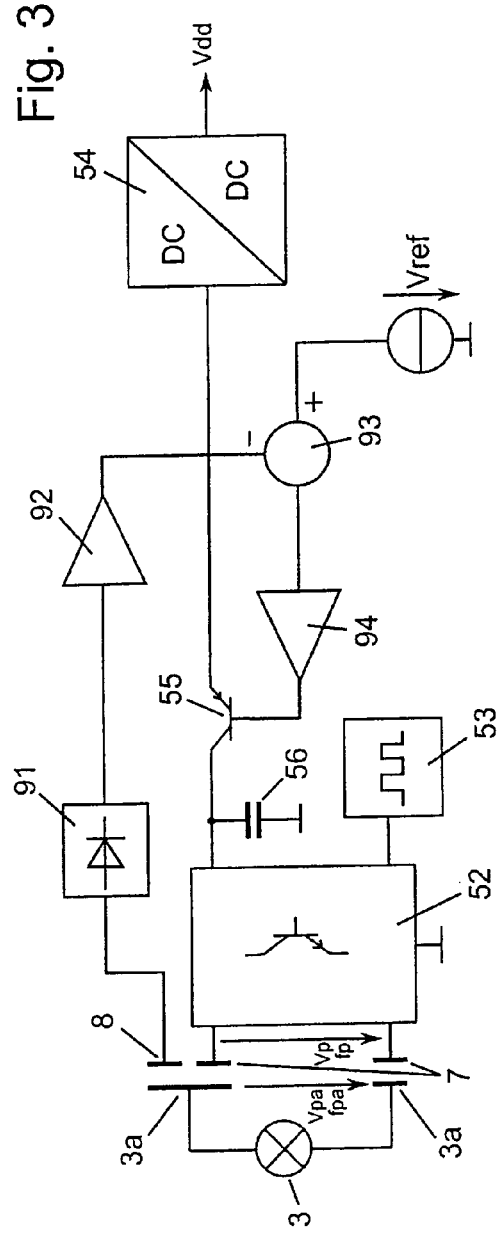

TESTING DEVICE FOR LIGHTING MEANS

The invention relates to a testing device for lighting means according to the generic characteristics of patent claim 1.

Various testing devices for lighting means are known from prior art.

U.S. Pat. No. 3,688,185, for example, discloses a testing device for fluorescent lamps based on two different measurement principles. On one hand this testing device has a device for continuity testing of the heating coil of the fluorescent lamp, by means of which it can be checked whether a conducting contact can be established via the heating coil of the fluorescent lamp. On the other hand, an inductor is provided, by means of which a high frequency electromagnetic field can be coupled to the fluorescent lamp in order to check, whether a sufficient gas filling of the fluorescent lamp is present. If a sufficient gas filling of the fluorescent lamp is present, the same is sufficiently excited by means of the high frequency electromagnetic field in order to get the fluorescent lamp to illuminate, at least in sections.

U.S. Pat. No. 5,047,721 describes a device for determining a defective lamp in a string of lights having a plurality of lamps switched in series, in which the voltage applied to a defective lamp is detected by means of a capacitive coupling of the testing device.

A disadvantage of the known testing devices is that a checking of lighting means having integrated upstream electronics is not possible. It is, for example, not possible using the testing devices of prior art, to completely check energy saving lamps having an integrated electronic upstream device.

Based on prior art, the invention is based on the object of providing a testing device for lighting means, which enables the checking of both conventional lamps and fluorescent lamps having integrated upstream electronics in a cost-effective and simple manner.

This object is solved by means of a testing device for lighting means having the characteristics of patent claim 1.

Additional advantageous embodiments are the object of the sub-claims.

According to the disclosed techniques, a testing device for lighting means operating at a nominal voltage and at a nominal frequency is provided, wherein a capacitive coupling of a test voltage is carried out at a testing frequency on the lighting means, and wherein a coupled testing voltage corresponds to the nominal voltage, and a coupled testing frequency corresponds to the nominal frequency.

The testing device therefore has the advantage that the checking of the lighting means is carried out at the nominal voltage and the nominal frequency of the lighting means, and a checking can therefore take place under operating conditions. Due to the fact that a voltage of, for example, 230 V at a frequency of, for example, 50 Hz is coupled to a lighting means, such as an energy saving lamp, it is possible to check the energy saving lamp in its entirety, i.e. upstream electronics, heating coil, and gas filling. It is therefore precluded, that although the gas filling of the energy saving lamp is correct, but that the lamp would still be assessed as defective due to an error in the upstream electronics.

In one configuration of the testing device, the capacitive coupling of the test voltage is carried out via insulated contact surfaces.

An insulated design of the contact surfaces for the capacitive coupling has the advantage that any contact of the contact surfaces is prevented, and electric shocks are prevented for the user, and any short-circuits of the contact surfaces. It is therefore possible to set up a testing device embodied in such manner, for example, in the show room of a retail store with free access for checking lamps. However, it is also possible to provide one or both contact surfaces so that they can be contacted. If a line breaker transformer is used for generating the test voltage, a contact-safe function is still ensured.

According to a preferred further embodiment of the testing device according to the invention a measuring device for measuring the coupled test voltage, and a control device for controlling the test voltage by means of a comparison of the measured test voltage to a reference voltage, is provided.

Such an embodiment has the advantage that a compensation of losses caused by the capacitive coupling of the test voltage is possible by means of the measurement of the coupled test voltage and the control of the test voltage. Preferably, the measurement of the coupled test voltage is carried out by means of a capacitive measuring device.

It is further advantageous, if a detection device is provided for the detection of the lighting means.

For example, it is possible with the detection device to embody the testing device such that the insertion of a lighting means is detected in the testing device by means of a low test voltage that does not correspond to the nominal voltage of the lighting means to be detected, and that the test voltage and the test frequency are not set to the level of the nominal voltage and the nominal frequency until the lighting means has been inserted. The testing device can be designed in a particularly energy saving manner by means of this measure.

According to another configuration of the testing device, a modification device is provided, which modifies the test voltage in a voltage range, and/or the test frequency in a frequency range.

It is possible with such a modification device to check the lighting means in a voltage range, and/or in a frequency range, and to determine, whether, for example, any malfunctions of the lighting means are to be expected in case of variations of the voltage and/or of the frequency of a power supply network.

In a preferred further embodiment of the testing device a generation device is provided for generating the test voltage from a low voltage energy supply. The generation device may comprise, for example, a transformer, or a DC converter.

Such an embodiment of the testing device has the advantage that, for example, a battery, or an accumulator may serve as a low voltage power supply, thus enabling a mobile application of the testing device. The use of a DC converter for generating the test voltage also provides a weight advantage as opposed to the use of a transformer.

Advantageously, a clock generator is provided for supplying the test frequency.

Such an embodiment of the testing device has the advantage that an exact adjustment of the test frequency is enabled by means of a clock generator in a very space-saving manner.

BRIEF DESCRIPTION OF THE DRAWINGS

FIG. 2 a first exemplary embodiment of the testing device having a transformer, and FIG. 3 a second exemplary embodiment of the testing device having a DC converter.

Unless otherwise stated, the same reference symbols denote identical or functionally equal assemblies in the figures.

FIG. 1 illustrates a simplified block diagram of a testing device 1 for lighting means 3. The testing device 1 is substantially comprised of a generating device 5 for providing a test voltage Vp, having a frequency fp. The test voltage Vp can be applied to insulated contact surfaces 7. The contact surfaces 7 are suitably arranged so as to enable a capacitive coupling of the test voltage Vp to a base 3a of the lighting means 3. A coupled test voltage Vpa is lower than the test voltage Vp due to losses occurring with the capacitive coupling, e.g. the base voltage of the generating device 5 must be selected correspondingly larger so that the coupled test voltage Vpa corresponds to the nominal voltage Vn. As illustrated in FIG. 1, the testing device further has a measurement device 8 for measuring the coupled test voltage Vpa. The measurement device 8 is embodied as a capacitive measuring device by means of an additional contact surface, and provides a measured test voltage Vpm at its outlet. The test voltage Vpm measured is lower than the coupled test voltage Vpa due to the losses discussed above, which also occur with the capacitive cap of the voltage.

Figure 1:
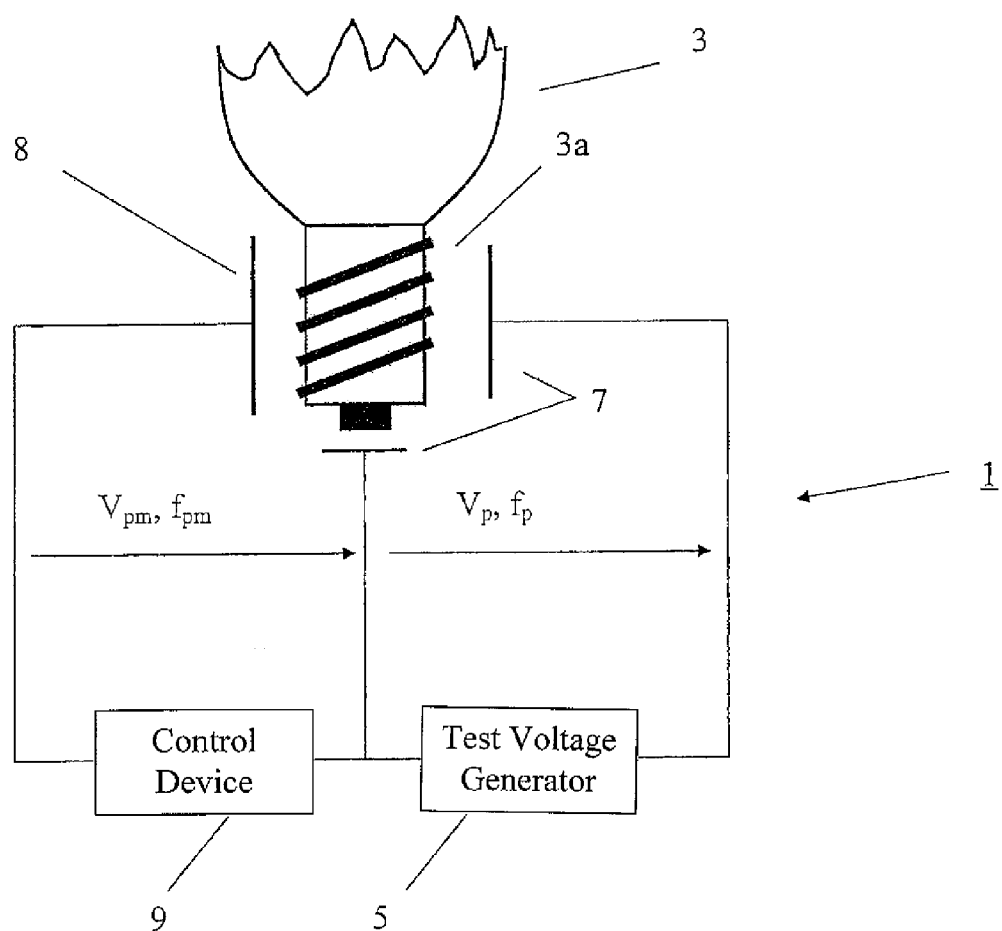
FIG. 1 a block diagram of a testing device.

The test voltage Vpm measured can be fed to a control device 9, by means of which a controlling of the test voltage Vp is enabled. The controlling of the test voltage Vp may also be carried out via the measurement of a current of the generating device 5 on the outlet side as an alternative. In this case, a capacitive tap of the coupled test voltage Vpa may be omitted. If a line breaker transformer is used for providing the test voltage Vp, it is also conceivable to embody one or both contact surfaces 7 such that they can be contacted. A contact-safe operation is guaranteed by means of the line transformer.

FIG. 2 illustrates a first exemplary configuration, wherein the generating device 5 has a transformer 51 for generating the test voltage Vp. The test voltage Vp can be accessed on the outlet side of the transformer 51, and can be supplied to the contact surfaces 7. The test voltage Vp can be coupled to the base 3a of the lighting means 3 via the contact surfaces 7. The coupled test voltage Vpa is tapped by the measuring device 8, and the measured test voltage Vpm is provided, and fed to a control branch. The measured test voltage Vpm has a measured frequency fpm. The measured test voltage Vpm is fed to a DC converter 91 for generating a DC voltage, and subsequently to a booster 92 in the control branch. The signal on the outlet side of the booster 92 is fed to a summation point 93 with a negative signature, to which a reference voltage Vref is simultaneously supplied. The signal of the summation point 93 on the outlet side is fed to a second booster 94, the outlet side signal of which can be fed to a driver step 52 as a control signal. A clock signal of a clock generator 53 can further be fed to the driver step 52. The clock signal has a frequency that is identical to the test frequency fp. The driver step 52 is further connected to the supply voltage Vdd, and drives the transformer 51 on the outlet side, to which the contact surfaces 7 are connected on the outlet side.

FIG. 3 illustrates a further exemplary configuration of the testing device. The configuration illustrated in FIG. 3 differs from the exemplary configuration of FIG. 2 only by the type of supply of the test voltage Vp. Therefore the following describes on the differently designed branch for providing the test voltage Vp. Based on the supply voltage Vdd a voltage signal is generated by means of a DC converter 54, which has a voltage value of a magnitude of the test voltage Vp. The voltage signal is controlled by an actuating member 55 by means of the signal of the second booster 94 from the control branch on the outlet side, and provided to the driver step 52. On the inlet side, a capacitor 56 is switched in series to the drier step 52 for smoothing the inlet signal against mass. The clock signal of the clock generator 53 is further fed to the driver step 52 so that a signal having a test voltage Vp and a test frequency fp can be tapped on the outlet side.

LIST OF REFERENCE SYMBOLS 1 testing device
3 lighting means
3a base
5 generating device
7 contact surfaces
8 measuring device
9 control device
51 transformer
52 driver step
53 clock generator
54 DC converter
55 actuating member
56 capacitor
91 rectifier
92 first booster
93 summation point
94 second booster
$V_n$ nominal voltage
$V_p$ test voltage
$V_{pa}$ coupled test voltage
$V_{pm}$ measured test voltage
$f_n$ nominal frequency
$f_p$ test frequency
$f_{pa}$ coupled test frequency
$f_{pm}$ measured test frequency
$V_{ref}$ reference voltage
$V_{dd}$ supply voltage

The invention claimed is:

1. A testing device for lighting means operated at a nominal voltage ($V_n$) and at a nominal frequency ($f_n$), the testing device comprising:
   a capacitive coupling to supply a test voltage ($V_p$) at a test frequency ($f_p$) to the lighting means through the capacitive coupling, thereby providing the lighting means with voltage through the capacitive coupling,
   wherein a coupled test voltage ($V_{pa}$) corresponds to the nominal voltage ($V_n$), and a coupled test frequency ($f_{pa}$) corresponds to the nominal frequency ($f_n$).

2. The testing device according to claim 1, characterized in that insulated contact surfaces are provided for coupling the test voltage ($V_p$).

3. The testing device according to claim 1, characterized in that
   a measuring device is provided for measuring the coupled test voltage ($V_{pa}$).

4. The testing device according to claim 1, characterized in that a control device is provided for controlling the test voltage ($V_p$) by means of a comparison of a measured test voltage ($V_{pm}$) to a reference voltage ($V_{ref}$).

5. The testing device according to claim 1, characterized in that a detection device is provided for the detection of the lighting means.

6. The testing device according to claim 1, characterized in that a modification device is provided, which modifies the test voltage ($V_p$) in a voltage range, and/or the test frequency ($f_p$) in a frequency range.

7. The testing device according to claim 1, characterized in that a generating device is provided for generating the test voltage ($V_p$) from a low voltage energy supply ($V_{dd}$).

8. The testing device according to claim 7, characterized in that the generating device comprises a transformer.

9. The testing device according to claim 7, characterized in that the generating device comprises a DC/DC converter.

10. A testing device for lighting means operated at a nominal voltage ($V_n$) and at a nominal frequency ($f_n$), the testing device comprising:
a capacitive coupling of a test voltage ($V_p$) at a test frequency ($f_p$) to the lighting means, characterized in that a clock generator is provided for supplying the test frequency ($f_p$),
wherein a coupled test voltage ($V_{pa}$) corresponds to the nominal voltage ($V_n$), and a coupled test frequency ($f_{pa}$) corresponds to the nominal frequency ($f_n$).

11. A testing device for a gas-filled lamp operated at a nominal voltage ($V_n$) and at a nominal frequency ($f_n$), and having integrated upstream electronics between power supply connections and a gas filled portion, the testing device comprising:
a capacitive coupling to supply a test voltage ($V_p$) at a test frequency ($f_p$) to the gas-filled lamp through the capacitive coupling, thereby providing the gas-filled lamp with voltage through the capacitive coupling,
wherein a coupled test voltage ($V_{pa}$) corresponds to the nominal voltage ($V_n$), and a coupled test frequency ($f_{pa}$) corresponds to the nominal frequency ($f_n$).

12. The testing device according to claim 11, characterized in that insulated contact surfaces are provided for coupling the test voltage ($V_p$).

13. The testing device according to claim 11, characterized in that a measuring device is provided for measuring the coupled test voltage ($V_{pa}$).

14. The testing device according to claim 11, characterized in that a control device is provided for controlling the test voltage ($V_p$) by means of a comparison of a measured test voltage ($V_{pm}$) to a reference voltage ($V_{ref}$).

15. The testing device according to claim 11, characterized in that a detection device is provided for the detection of the gas-filled lamp.

16. The testing device according to claim 11, characterized in that a modification device is provided, which modifies the test voltage ($V_p$) in a voltage range, and/or the test frequency ($f_p$) in a frequency range.

17. The testing device according to claim 11, characterized in that a transformer is provided for generating the test voltage ($V_p$) from a low voltage energy supply ($V_{dd}$).

18. The testing device according to claim 11, characterized in that a DC/DC converter is provided for generating the test voltage ($V_p$) from a low voltage energy supply ($V_{dd}$).

19. The testing device according to claim 11, characterized in that a clock generator is provided for supplying the test frequency ($f_p$).

* * * * *